(12) United States Patent
Chen et al.

(10) Patent No.: US 11,917,859 B2
(45) Date of Patent: Feb. 27, 2024

(54) DISPLAY MODULE AND DISPLAY DEVICE (71) Applicants: Chengdu BOE Optoelectronics Technology Co., Ltd., Sichuan (CN); BOE Technology Group Co., Ltd., Beijing (CN)

(72) Inventors: Zuquan Chen, Beijing (CN); Wei Qing, Beijing (CN); Zhihui Wang, Beijing (CN); Xingguo Liu, Beijing (CN); Shaokui Liu, Beijing (CN); Wei Zeng, Beijing (CN); Danping Shen, Beijing (CN); Ce Wang, Beijing (CN); Qiang Tang, Beijing (CN)

(73) Assignees: Chengdu BOE Optoe ctroni Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/776,493

(22) PCT Filed: Jun. 1, 2021

(86) PCT No.: PCT/CN2021/097689
§ 371 (c)(1),
(2) Date: May 12, 2022

(87) PCT Pub. No.: WO2021/259018
PCT Pub. Date: Dec. 30, 2021

(65) Prior Publication Data
US 2023/0255053 A1    Aug. 10, 2023

(30) Foreign Application Priority Data

Jun. 24, 2020 (CN) .......................... 202010591266.3

(51) Int. Cl.
*H05K 7/20* (2006.01)
*H10K 50/87* (2023.01)

(52) U.S. Cl.
CPC ......... *H10K 50/87* (2023.02); *H05K 7/20963* (2013.01)

(58) Field of Classification Search
CPC .......................... H05K 7/20963; H10K 50/87
See application file for complete search history.

(56) References Cited

U.S. PATENT DOCUMENTS 6,967,439 B2 * 11/2005 Cok ................... H10K 50/8423
313/45
2010/0156763 A1 * 6/2010 Lee ........................ H10K 50/87
345/76

(Continued)

FOREIGN PATENT DOCUMENTS

| CN | 201813580 U | 4/2011 |
| CN | 104820314 A | 8/2015 |

(Continued)

OTHER PUBLICATIONS

CN202010591266.3 first office action.
CN202010591266.3 second office action.
CN202010591266.3 third office action.

*Primary Examiner* — Mukundbhai G Patel
(74) *Attorney, Agent, or Firm* — IPro, PLLC (57) ABSTRACT

Provided is a display module. The display module includes: a display panel and a heat dissipation structure; wherein the display panel includes a substrate and a display substrate layer disposed on the substrate, and the heat dissipation structure is disposed on a side, distal from the display substrate layer, of the substrate; and a gap is formed between at least a partial region of the heat dissipation structure and the substrate.

14 Claims, 4 Drawing Sheets

A-A (56) References Cited

U.S. PATENT DOCUMENTS

2015/0311137 A1\* 10/2015 Oganesian .......... H01L 23/3677
                                                    257/712
2015/0362791 A1   12/2015 Kakuda et al.
2021/0360827 A1\* 11/2021 Wang ................. H05K 7/20481

FOREIGN PATENT DOCUMENTS

| CN | 106129088 A | 11/2016 |
| CN | 110690263 A | 1/2020 |
| CN | 111628110 A | 9/2020 |
| GB | 201903050   | 4/2019 |
| GB | 2581998 A   | 9/2020 |
| JP | 2012124409 A | 6/2012 |
| TW | M477610 U   | 5/2014 |

\* cited by examiner

DISPLAY MODULE AND DISPLAY DEVICE

CROSS-REFERENCE TO RELATED APPLICATION

The present disclosure is a US national stage of international application No. PCT/CN2021/097689, filed on Jun. 1, 2021, which claims priority to Chinese Patent Application No. 202010591266.3, filed on Jun. 24, 2020 and entitled "DISPLAY MODULE AND DISPLAY DEVICE", the contents of which are herein incorporated by reference in their entireties.

TECHNICAL FIELD

The present disclosure relates to the field of display technologies, and relates to a display module and a display device.

BACKGROUND

As the application conditions of organic light emitting diode (OLED) display panels become increasingly complex, the power consumption of the chips in OLED display panels keeps increasing, resulting in an increasingly prominent heat dissipation problem of flexible screens.

SUMMARY

The present disclosure provides a display module and a display device. The technical solutions are as follows.

In a first aspect, embodiments of the present disclosure provide a display module. The display module includes a display panel and a heat dissipation structure; wherein
 the display panel includes a substrate and a display substrate layer disposed on the substrate, and the heat dissipation structure is disposed on a side, distal from the display substrate layer, of the substrate; and
 a gap is formed between at least a partial region of the heat dissipation structure and the substrate.

In a possible implementation, the heat dissipation structure includes at least one protruding structure, a gap is formed between each protruding structure and the substrate, and the protruding structure is protruded away from the substrate.

In a possible implementation, the protruding structure includes a first curved surface structure.

In a possible implementation, the heat dissipation structure further includes at least one transition structure, and the transition structure is connected to the protruding structure.

In a possible implementation, the transition structure includes a recessed structure, and the recessed structure is recessed toward the substrate.

In a possible implementation, the recessed structure includes a second curved surface structure.

In a possible implementation, in the case that the protruding structure includes a first curved surface structure, a boundary of the first curved surface structure on a first section is in a first arc, and a boundary of the second curved surface structure on the first section is in a second arc. A radius of the first arc is equal to a radius of the second arc, and the first section is perpendicular to a surface, distal from the display substrate layer, of the substrate.

In a possible implementation, at least one of the first curved surface structure and the second curved surface structure is a hemispherical shell.

In a possible implementation, at least one of the first curved surface structure and the second curved surface structure is obtained by bending a straight plate structure.

In a possible implementation, the radius of the first arc and the radius of the second arc both range from 0.5 mm to 3 mm.

In a possible implementation, a maximum distance between the protruding structure and the recessed structure in a first direction ranges from 0.1 mm to 0.2 mm. The first direction is perpendicular to a surface, distal from the display substrate layer, of the substrate.

In a possible implementation, the transition structure includes a straight plate structure.

In a possible implementation, the at least one protruding structure includes at least one pair of protruding structures, and two protruding structures in each pair of protruding structures are connected by the transition structure.

In a possible implementation, the transition structure satisfies any of the followings: a side, facing the substrate, of the transition structure is at least partially attached to the substrate, and a gap is formed between the transition structure and the substrate.

In a possible implementation, the gap between the heat dissipation structure and the substrate is filled with a thermal conductive material.

In a possible implementation, the thermal conductive material includes thermal conductive silicone.

In a possible implementation, the heat dissipation structure is an integrated structure.

In a possible implementation, a material of the heat dissipation structure includes at least copper, aluminum, or an aluminum alloy.

In a possible implementation, the display panel is an organic light emitting diode (OLED) display panel.

In a second aspect, the embodiments of the present disclosure further provide a display device. The display device includes the display module described in the first aspect of the embodiments of the disclosure.

BRIEF DESCRIPTION OF DRAWINGS

The foregoing and/or additional aspects and advantages of the present disclosure will become apparent and readily understood from the following descriptions of the embodiments, taken in conjunction with the accompanying drawings, in which.

DETAILED DESCRIPTION

The present disclosure is described in detail hereinafter. Embodiments of the present disclosure are illustrated in the accompanying drawings, in which same or similar reference numerals refer to the same or similar parts or parts having the same or similar function throughout. Moreover, if a detailed description of known techniques is not necessary for the illustrated features of the disclosure, it is omitted. The embodiments described below with reference to the accompanying drawings are exemplary, which are used to explain the present disclosure and are not to be construed as limitation.

Unless otherwise defined, it may be understood that all terms (including technical and scientific terms) used herein have the same meaning as generally understood by persons skilled in the art. It is further understood that terms, such as those defined in general dictionaries, should be interpreted as having a meaning that is consistent with the meaning in the context of the prior art and shall not be interpreted in an idealized or overly formal sense unless specifically defined herein.

It should be understood by persons skilled in the art that the singular forms "a/an", "one", "said", and "the" may include the plural forms as well, unless expressly stated otherwise. It should be further understood that the term "comprise/include" used in this specification indicates the presence of described features, integers, steps, operations, elements, and/or components, but does not preclude the presence or addition of one or more other features, integers, steps, operations, elements, components, and/or groups thereof. The term "and/or" used herein includes all or any and all combinations of one or more of the related items that are listed.

Currently, the solution to dissipate heat of the OLED display panel is to attach a flat heat sink on the back of the display screen in the OLED display panel. The heat sink is closely attached to the display screen to increase the heat dissipation effect of the display screen to some extent.

However, as the power consumption of the chips in the OLED display panel increases, this heat dissipation solution has a limited improvement on heat dissipation efficiency. Therefore, the heat dissipation solution of the OLED display panel needs to be improved.

The technical solutions of the present disclosure and how the technical solutions of the present disclosure solve the above technical problems are described in detail hereinafter in the embodiments of the present disclosure.

Figure 1:
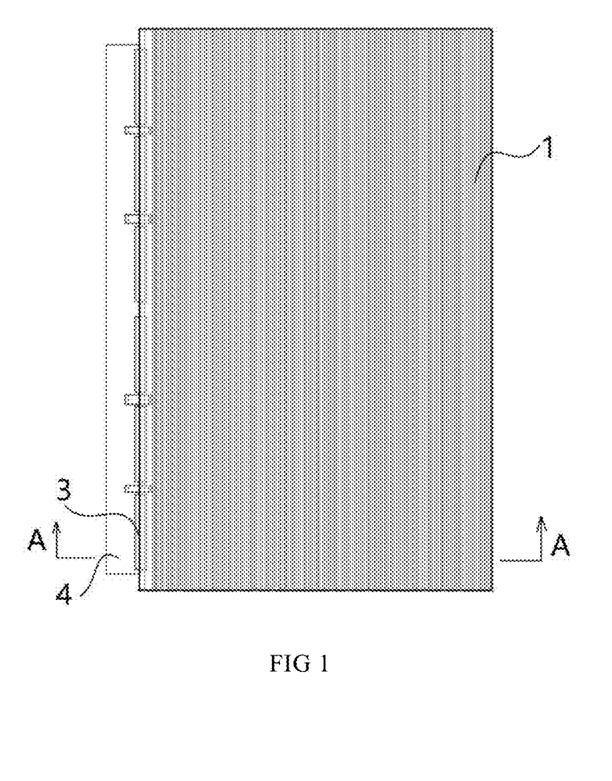
FIG. 1 is a schematic diagram of an overall structure of a display module according to an embodiment of the present disclosure.
Figure 2:
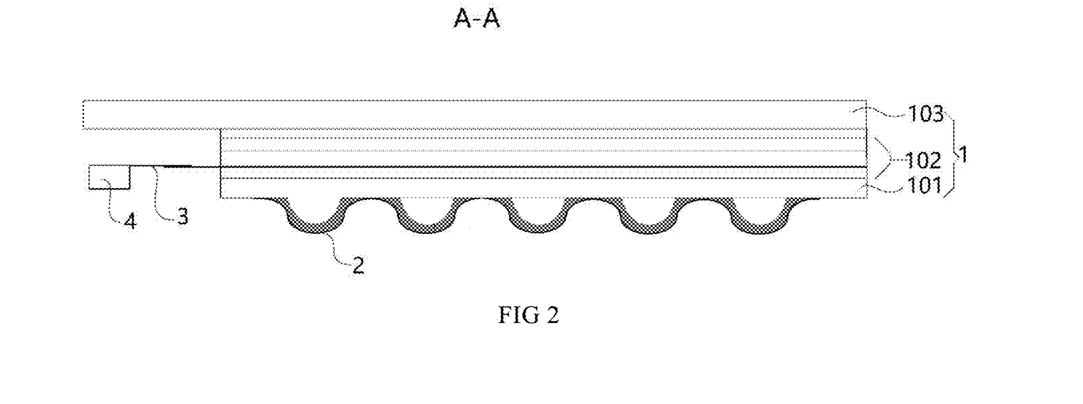
FIG. 2 is a schematic structural diagram taken along section A-A of FIG. 1 according to an embodiment of the present disclosure.

The embodiments of the present disclosure provide a display module. As shown in FIGS. 1 and 2, the display module includes a display panel 1 and a heat dissipation structure 2. The display panel 1 includes a substrate 101 and a display substrate layer 102. The display substrate layer 102 is disposed on the substrate 101. The heat dissipation structure 2 is disposed on the side, distal from the display substrate layer 102, of the substrate 101. A gap is formed between at least a partial region of the heat dissipation structure 2 and the substrate 101. FIG. 2 is a schematic sectional view of FIG. 1 taken at AA.

In the display module provided by the embodiments of the present disclosure, a gap is formed between at least a partial region of the heat dissipation structure 2 and the substrate 101. Compared with the flat heat sink attached to the surface of the display panel, the surface area of the heat dissipation structure 2 is increased, which helps increase the heat dissipation efficiency of the display panel 1 and increase the elasticity of the heat dissipation structure. The heat dissipation structure can absorb impact energy when the display module is impacted, which improves the impact resistance of the display panel.

In the embodiments of the present disclosure, the display panel 1 may be an OLED display panel or other type of display panel. The embodiments of the present disclosure are illustrated by taking an example in which the display panel 1 is an OLED display panel. The display substrate layer 102 of the OLED display panel may include a buffer layer, a switching device layer, a light-emitting device layer, an encapsulation layer, and the like. The buffer layer may be stacked on the substrate 101, and the heat dissipation structure 2 is disposed on the side of the substrate 101 distal from the buffer layer. It should be noted that the film layers in the display substrate layer 102 are not limited thereto, and the basic light-emitting structure of the display panel in the display substrate layer 102 is only exemplarily illustrated herein, which is not used to limit the structure of the display panel 1.

Optionally, in the display panel 1 in the embodiments of the present disclosure, a touch layer or the like may further be disposed on the side, distal from the substrate 101, of the display substrate layer 102, to form a display panel with a touch function. In addition, the display module provided by the embodiments of the present disclosure may further include a polarizer, a glass cover 103 and the like on the touch layer.

Optionally, as shown in FIGS. 1 and 2, the display module in the embodiments of the present disclosure may further include a flexible printed circuit (FPC) 3 connected to the pad region (bonding region) of the display panel 1, and a printed circuit board (PCB) 4 connected to the FPC 3. A control chip is integrated on the PCB, for controlling the display of the display panel 1.

As a gap is formed between at least a partial region of the heat dissipation structure 2 and the substrate 101, the sectional shape of the heat dissipation structure can be reconstructed such that at least one protruding structure is formed on the surface of heat dissipation structure 2. A gap is formed between each protruding structure and the substrate 101, and the protruding structure is protruded away from the substrate 101. The implementations of the protruding structure can be selectively set according to the heat dissipation needs and the preparation process. For example, a gap may be formed between the protruding position of the protruding structure and the substrate 101, and the region around the protruding position may attach to the substrate. In this case, a plurality of gaps are formed between the heat dissipation structure 2 and the substrate 101. Correspondingly, there are a plurality of connection points between the heat dissipation structure 2 and the substrate 101, such that heat of the substrate 101 can be transferred to the heat dissipation structure through the plurality of the connection points, which helps improve the heat dissipation efficiency. In addition, the plurality of connection points can ensure the stability of connection between the heat dissipation structure 2 and the substrate 101.

Optionally, the gap between the heat dissipation structure 2 and the substrate 101 may also be a complete gap space between the entire heat dissipation structure 2 and the substrate 101, that is, a gap is formed between the entirety of the heat dissipation structure 2 and the substrate 101. In this case, the heat dissipation structure 2 may be indirectly connected to the substrate 101 by other structures. For example, the heat dissipation structure 2 is a complete curved surface structure, and the curved surface structure is indirectly connected to the substrate 101 by other structures. In this way, for the same projected area (corresponding to the heat dissipation area of the display panel 1), the curved surface structure increases the heat dissipation area relative to the flat heat sink.

Figure 3:
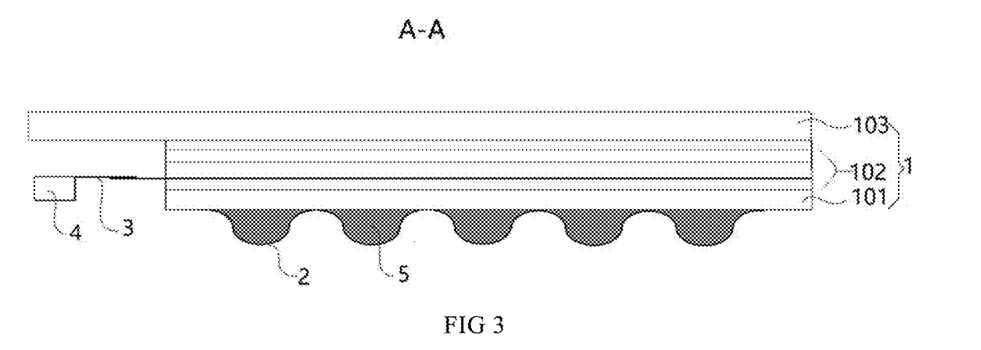
FIG. 3 is a schematic structural diagram taken along section A-A of FIG. 1 according to another embodiment of the present disclosure.

Optionally, the gap between the heat dissipation structure 2 and the substrate 101 may be filled with a thermal conductive material. As shown in FIG. 3, FIG. 3 is a schematic structural diagram after the gap between the heat dissipation structure 2 and the substrate 101 is filled with the thermal conductive material on the basis of FIG. 2. All of the thermal conductive material filled between heat dissipation structure 2 and the substrate 101 may be regarded as a thermal conductive layer 5. The thermal conductive layer 5 can transfer heat generated during operation of the display panel 1 to the heat dissipation structure 2, so as to dissipate heat by means of the heat dissipation structure 2, which is equivalent of an increase the surface area of the heat dissipation structure 2 when the same heat dissipation region on the substrate 101 is covered, thereby further improving heat dissipation efficiency.

When the gap is formed between a partial region of the heat dissipation structure 2 and the substrate 101, the thermal conductive material may be filled in the gap. When the gap is formed between the entirety of heat dissipation structure 2 and the substrate 101, the thermal conductive material may be filled between the entire heat dissipation structure 2 and the substrate 101. In this case, the heat dissipation structure 2 may be connected to the substrate 101 by the thermal conductive material, and the difficulty of filling the thermal conductive material in the gap between the heat dissipation structure 2 and the substrate 101 can be reduced.

The thermal conductive material only needs to have good thermal conductivity and to be filled easily. The specific material of the thermal conductive material may not be limited in the embodiments of the present disclosure. In some embodiments, the thermal conductive material may be thermal conductive silicone in consideration of the filling property of the thermally conductive material.

By filling the thermal conductive silicone in the gap between the heat dissipation structure 2 and the substrate 101, the contact thermal resistance generated between the heat dissipation structure 2 and the substrate 101 can be reduced by the thermal conductive silicone, and the gap between the heat dissipation structure 2 and the substrate 101 can be well filled, such that air is squeezed out of the gap, and the heat dissipation structure 2 and the substrate 101 can be in full contact with each other. In this way, the heat dissipation structure 2 and the substrate 101 are in face-to-face contact with each other, such that the temperature difference between the heat dissipation structure 2 and the substrate 101 is minimized as much as possible, in order to dissipate heat of the display panel 1 by the heat dissipation structure 2 as soon as possible. Moreover, since the thermal conductive silicone has good ductility, the resilience of the heat dissipation structure 2 may also be increased by means of the thermal conductive silicone, to provide buffering for the display panel 1 by means of the heat dissipation structure 2, thereby improving the impact resistance of the display panel 1.

In some embodiments, the protruding structure may include a first curved surface structure. For example, the heat dissipation structure may include a plurality of first curved surface structures. Alternatively, the heat dissipation structure further includes at least one transition structure, and the transition structure is connected to the protruding structure. Optionally, the at least one protruding structure may include at least one pair of protruding structures, and two protruding structures in each pair of protruding structures are connected by the transition structure. For example, a recessed structure may be between adjacent two protruding structures.

In addition, the transition structure may satisfy any of the following conditions: the side, facing the substrate, of the transition structure is at least partially attached to the substrate; and a gap is formed between the transition structure and the substrate. In the case that the side, facing the substrate, of the transition structure is at least partially attached to the substrate, the surface, facing the substrate, of the transition structure may be partially attached to the substrate, or the surface, facing the substrate, of the transition structure may be entirely attached to the substrate. A gap being formed between the transition structure and the substrate refers to that a gap is formed between the entirety of the transition structure and the substrate. In this case, there is no contact point between the transition structure and the substrate, and the transition structure and the substrate may be indirectly connected by other structures, such as the thermal conductive material.

There are various implementations of the transition structure. The implementations of the transition structure are illustrated by taking the following two ways as examples in the embodiments of the present disclosure.

In an implementation of the transition structure, the transition structure includes a recessed structure. The recessed structure is recessed toward the substrate. The implementation of the recessed structure may be designed according to application requirements. Optionally, the recessed structure may include a second curved surface structure, and the second curved surface structure is bent in a direction away from the substrate 101.

Figure 4:
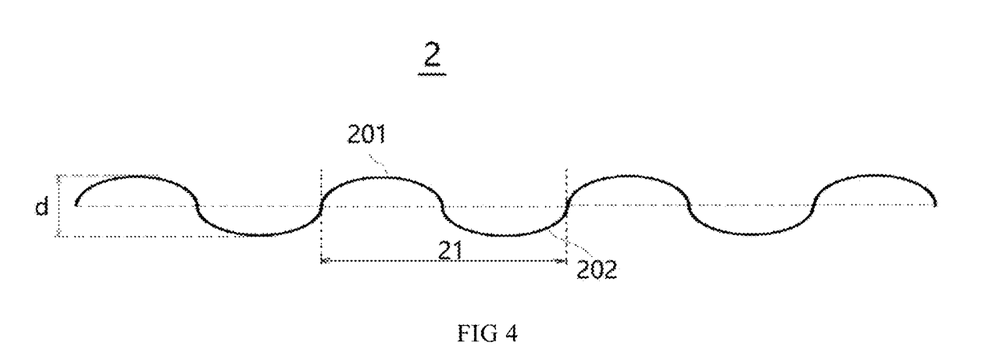
FIG. 4 is a schematic sectional view of a heat dissipation structure according to an embodiment of the present disclosure.

For example, as shown in FIG. 4, the heat dissipation structure 2 may be of a corrugated structure, i.e., the boundary of the heat dissipation structure 2 at a first cross section is corrugated. In an implementation, the corrugated structure includes a plurality of first curved surface structures 201 and a plurality of second curved surface structures 202, and the second curved surface structure 202 is disposed between adjacent first curved surface structures 201, such that the first curved surface structures 201 and the second curved surface structures 202 are alternately distributed. In addition, the first surface structure 201 and the second surface structure 202 are bent in opposite directions, and the first curved surface structure 201 is bent in a direction going close to the substrate 101, such that the first curved surface structures 201 and the second curved surface structures 202 which are alternately distributed form a corrugated structure.

In the corrugated structure, the first curved surface structure 201 is connected to the substrate 101 (the first curved surface structure 201 includes a top portion closest to the substrate 101, and a curved portion distal from the substrate 101, and the top portion of the first curved structure is connected to the substrate 101). The gap enclosed by the second curved surface structure 202, the first curved surface structures 201 on both sides of the second curved surface structure 202 (i.e., the curved portion of the first curved surface structure 201), and the substrate 101 are filled with the thermal conductive material.

In the display module provided by the embodiments of the present disclosure, the heat dissipation structure 2 is set to be of a corrugated structure including the first curved surface structures 201 and the second curved surface structures 202 which are alternately arranged. As the corrugated structure can further increase the heat dissipation area of the heat dissipation structure 2, the heat dissipation effect of heat dissipation structure 2 on the display panel 1 is further improved.

The first curved structures 201 and the second curved structures 202 which are bent in opposite directions are arranged alternately, such that the side, facing the substrate 101, of the heat dissipation structure 2 and the side, backing onto the substrate 101, of the heat dissipation structure 2 present as a corrugated surface. A gap may be formed in the region between the corrugated surface and the substrate 101 (for example, a gap is formed in the region enclosed by the second curved surface structure 202, the first curved surface structures 201 on both sides of the second curved structure 202, and the substrate 101). In addition, the gap may be filled with a thermal conductive material. By filling the gap with the thermal conductive material, on the premise of not affecting the heat transfer effect, the heat dissipation surface area of the heat dissipation structure 2 is further increased, which facilitates the improvement of the heat dissipation efficiency It should be noted that FIG. 4 only shows the boundary of the first curved surface structure 201 and the boundary of the second curved surface structure 202 on the first section, and the first curved surface structure 201 and the second curved surface structure 202 may be structures acquired by extending the first section along a direction parallel to the surface of the substrate distal from the display substrate layer.

In some embodiments, as shown in FIG. 4, any adjacent first curved surface structure 201 and second curved surface structure 202 may form one corrugation period 21 of the corrugated structure. In each corrugation period 21, the first curved structure 201 and the second curved structure 202 is smoothly connected. The smooth connection between the first curved surface structure 201 and the second curved surface structure 202 can facilitate the filling of the thermal conductive material when the gap between the corrugation period 21 and the substrate 101 is to be filled with the thermal conductive material.

In the embodiments of the present disclosure, the heat dissipation structure 2 of the corrugated structure includes a plurality of corrugation periods 21, and each corrugation period 21 includes one first curved structure 201 and one second curved structure 202. In the same corrugation period 21 illustrated in FIG. 4, the first curved surface structure 201 is disposed on the left side of the second curved surface structure 202, and a second end of the first curved surface structure 201 is smoothly connected to a first end of the second curved surface structure 202.

Optionally, for different corrugation periods 21, the second curved surface structure 202 in a former corrugation period 21 and the first curved surface structure 201 in a latter corrugation period 21 are smoothly connected, such that the first curved surface structures 201 and the second curved surface structures 202 in the entire heat dissipation structure 2 are smoothly connected alternately. In this way, on the one hand, the heat dissipation area of the entire heat dissipation structure 2 is larger, and on the other hand, the buffer performance of the heat dissipation structure 2 in the direction perpendicular to display panel 1 can be increased.

In some embodiments, as shown in FIG. 4, the boundary of the first curved surface structure 201 on the first section may be may be in a first arc, the boundary of second curved surface structure 202 on the first section may be in a second arc, and the radius of the first arc and the radius of the second arc may be equal.

The radius of the first arc and the radius of the second arc are equal. That is, the first curved surface structure 201 and the second curved surface structure 202 have the same curved surface radius, and have the same span and curvature. In this case, only the bending directions of the first curved surface structure 201 and the second curved surface structure 202 are opposite. It should be understood that the first arc and the second arc may also be unequal, and which is not limited in the embodiments of the present disclosure.

In some embodiments, the radius of the first arc may range from 0.5 mm to 3 mm, and includes end values of 0.5 mm and 3 mm In some embodiments, the radius of the second arc equals the radius of the first arc, ranging from 0.5 mm to 3 mm, and includes end values of 0.5 mm and 3 mm.

In a possible implementation, the first curved surface structure 201 and the second curved surface structure 202 may be rotationally symmetric structures. As shown in FIG. 2, the second curved surface structure 202 may be obtained by rotating the first curved surface structure 201 by 180°. As such, when the heat dissipation structure 2 is manufactured with a mould by one-time press molding, the manufacture of the mould of the heat dissipation structure 2 can be facilitated. In addition, as there is no need to consider the front side and back side of the first curved surface structure 201 and the second curved surface structure 202 during installation, the efficiency of installing the heat dissipation structure 2 can be improved.

Optionally, at least one of the first curved surface structure 201 and the second curved surface structure 202 is a hemispherical shell. For example, as shown in FIGS. 2 and 3, the first curved surface structure 201 and the second curved surface structure 202 are both hemispherical shells.

Alternatively, at least one of the first curved surface structure 201 and the second curved surface structure 202 is obtained by bending a straight plate structure. For example, the first curved surface structure 201 and the second curved surface structure 202 may both be a structure obtained by holding opposite ends of the straight plate structure and squeezing each end toward the opposite end.

In some embodiments, a maximum distance d between the protruding structure and the recessed structure in the first direction (i.e., in the thickness direction of heat dissipation structure 2) ranges from 0.1 mm to 0.2 mm, and includes the end values of 0.1 mm and 0.2 mm. The first direction is perpendicular to the surface, distal from the display substrate layer, of the substrate 101.

The maximum distance between the first curved surface structure 201 and the second curved surface structure 202 in the direction perpendicular to the substrate 101 (i.e., in the thickness direction of heat dissipation structure 2) is the maximum distance d between the first curved surface structure 201 and the second curved surface structure 202 in the thickness direction of heat dissipation structure 2, which is the distance between the top of the arc of the first curved surface structure 201 and the top of the arc of the second curved surface structure 202 in the thickness direction. The distance determines the overall thickness of the heat dissipation structure 2 after it is attached. The thickness of the entire display module will be affected if the distance is too large, and the heat dissipation effect of the heat dissipation structure 2 will be poor if the distance is too small.

For example, as shown in FIG. 4, for one corrugation period 21, the top of the arc of the first curved surface structure 201 may be regarded as a crest of the corrugation period 21, the top of the arc of the second curved surface structure 202 may be regarded as a trough of the corrugation period 21. The maximum distance d between the first curved surface structure 201 and the second curved surface structure 202 in the thickness direction of the heat dissipation structure 2 (the vertical direction shown in FIG. 4) is the distance between the crest and the trough in the thickness direction of heat dissipation structure 2, and the maximum distance d may be referred to as the amplitude of the corrugation period 21.

In some embodiments, in the case that both the first arc and the second arc are half arcs, the maximum distance between the first curved surface structure 201 and the second curved surface structure 202 in the thickness direction of the heat dissipation structure 2 is the sum of the radius of the first arc and the radius of the second arc.

It is to be noted that given that the thickness of the heat dissipation structure 2 itself is small, the size of the maximum distance and the size of the radius in the embodiments of the present disclosure may both include the thickness of the heat dissipation structure 2 itself.

Figure 5:
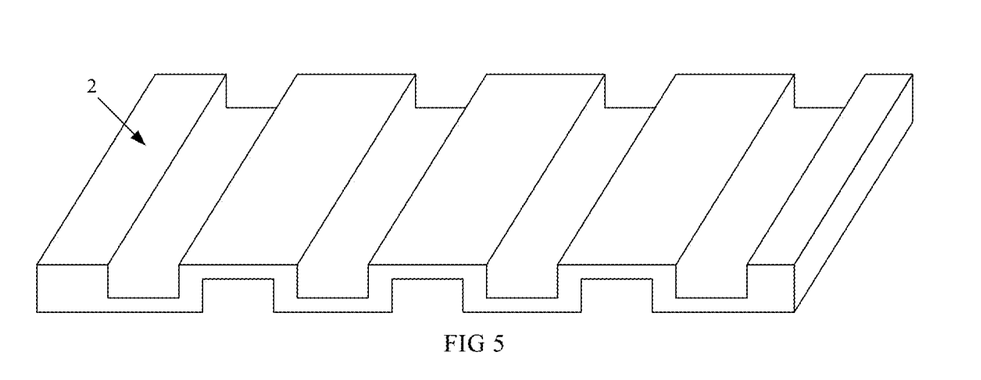
FIG. 5 is a schematic structural diagram of a heat dissipation structure according to an embodiment of the present disclosure.
Figure 6:
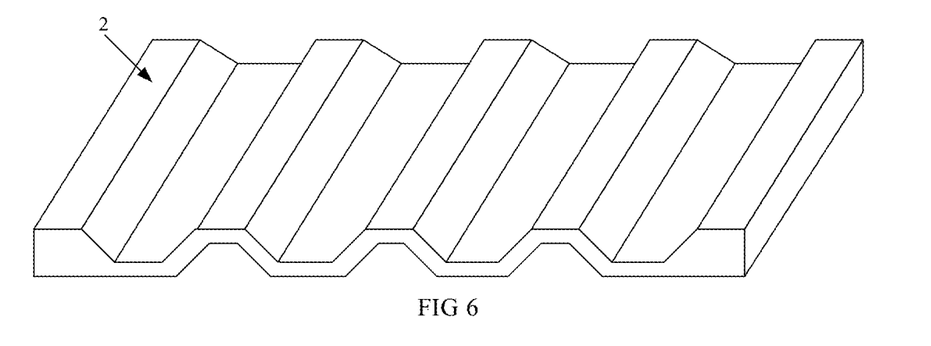
FIG. 6 is a schematic structural diagram of another heat dissipation structure according to an embodiment of the present disclosure.
Figure 7:
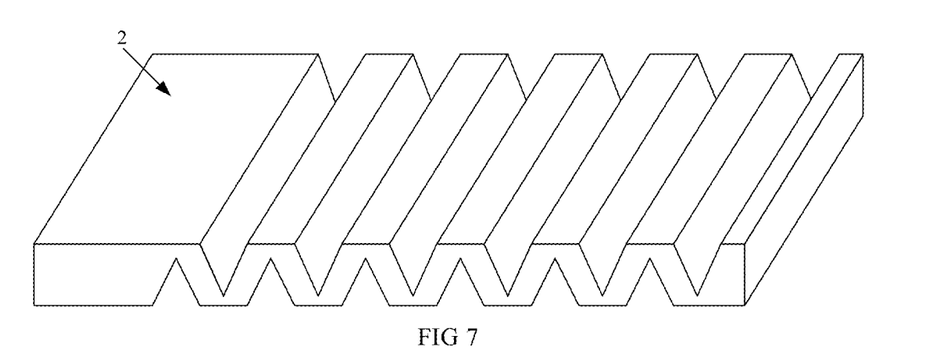
FIG. 7 is a schematic structural diagram of yet another heat dissipation structure according to an embodiment of the present disclosure.
Figure 8:
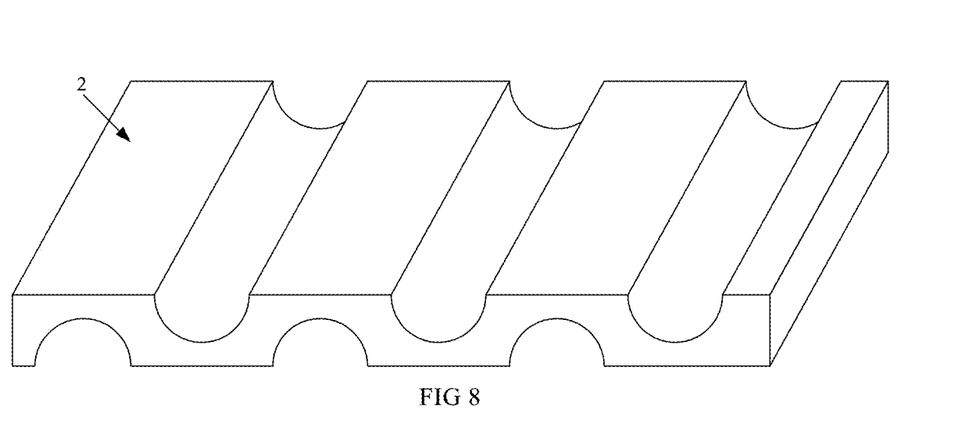
FIG. 8 is a schematic structural diagram of yet another heat dissipation structure according to an embodiment of the present disclosure.

It is appreciated that the protruding structure includes the first curved surface structure, which is an optional implementation of the protruding structure provided by the embodiments of the present disclosure. In practices, the protruding structure can also have other configurations. For example, the boundary of the protruding structure on the first section may also be rectangular, trapezoidal, zigzag, or in other shapes. Here, the first section is perpendicular to the surface, distal from the display substrate layer, of the substrate 101. FIGS. 5, 6, and 7 are schematic diagram showing the boundary of the protruding structure on the first section being rectangular, trapezoidal, and zigzag, respectively. In addition to the above implementations, the configuration of the protruding structure may be in other implementations. For example, the protruding structure may also be a structure acquired by excavating several semi-cylinders on both sides of a cuboid, as shown in FIG. 8.

Figure 9:
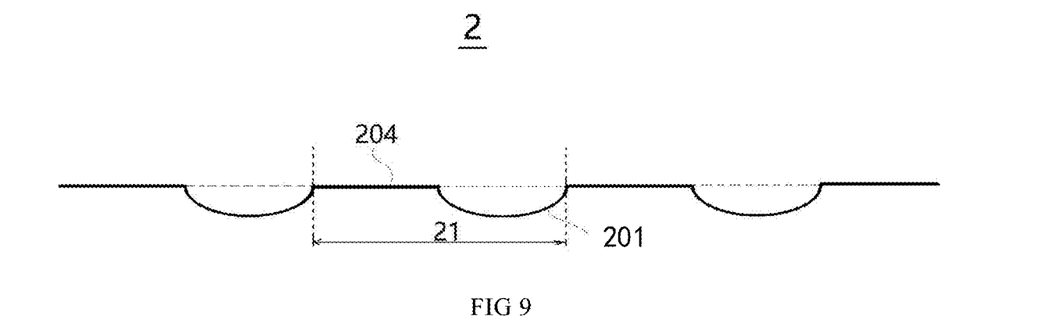
FIG. 9 is a schematic sectional view of another heat dissipation structure according to an embodiment of the present disclosure.

In an implementation of the transition structure, the transition structure includes a straight plate structure 204. In some embodiments, as shown in FIG. 9, the heat dissipation structure 2 includes straight plate structures 204 and first curved surface structures 201 protruding toward the side distal from the substrate 101. In addition, the first curved structures 201 and the straight plate structures 204 are alternately arranged. The straight plate structure 204 is attached to the substrate 101 to connect the heat dissipation structure 2 and the substrate 101 of the display panel 1, and the thermal conductive material is filled between the first curved structure 201 and the substrate 101.

In this case, under the condition of the same thickness of the heat dissipation structure 2, the curved surface radius of the first curved surface structure 201 may be increased, and the width of the straight plate structure 204 in the first direction (the first direction is the direction in which the corrugated structure periodically extends, i.e., the horizontal direction in FIG. 9) may be reduced as much as possible on the premise of ensuring the connection strength, so as to fill more thermal conductive materials, which helps improve the heat dissipation efficiency.

Optionally, the heat dissipation structure may also include a protruding structure, a recessed structure, and a straight plate structure simultaneously. Moreover, the heat dissipation structure may also include structures in other shapes. For example, the heat dissipation structure may be acquired by combining part or all of a protruding structure, a recessed structure, a straight plate structures, and structures in other shapes.

In some embodiments, to ensure the heat dissipation effect, the material of the heat dissipation structure 2 at least includes copper, aluminum, or an aluminum alloy. For example, the heat dissipation structure 2 may be prepared as a copper sheet, an aluminum sheet, or an aluminum alloy sheet with a corrugated structure.

Optionally, the material of heat dissipation structure 2 may also include silver without taking into account the process cost of the heat dissipation structure 2.

Moreover, the heat dissipation structure provided by the embodiments of the present disclosure may be an integrated structure, which can effectively ensure the thermal conductivity of the heat dissipation structure, and help improve the heat dissipation efficiency.

In summary, in the display module provided by the embodiments of the present disclosure, a gap is formed between at least a partial region of the heat dissipation structure and the substrate. Compared with the flat heat sink attached to the surface of the display panel, the surface area of the heat dissipation structure is increased, which helps increase the heat dissipation efficiency of the display panel and increase the elasticity of the heat dissipation structure. The heat dissipation structure can absorb impact energy when the display module is impacted, which improves the impact resistance of the display panel.

Moreover, through combination of the shape design of the heat dissipation structure and thermal conductive material, the elasticity of heat dissipation structure is also increased on the premise of improving the heat dissipation performance, thereby improving the impact resistance of the display panel. For example, when the display panel encounters a falling ball impact, the heat dissipation structure and the thermal conductive material can absorb the impact energy, thereby improving the display screen's resistance to the falling ball impact.

Based on the same inventive concept, the embodiments of the present disclosure further provide a display device. The display device includes any of the display modules provided in the embodiments of the present disclosure.

The display device in the embodiments of the present disclosure includes the display module in the aforementioned embodiments. For example, the display module includes a display panel and a heat dissipation structure. A gap is formed between at least a partial region of the heat dissipation structure 2 and the substrate 101 of the display panel 1, and a thermal conductive material may be filled in the gap. The thermal conductive material is used to transfer heat generated during operation of the display panel 1 to the heat dissipation structure 2 for dissipation, which is equivalent of an increase the surface area of the heat dissipation structure 2 when the same heat dissipation region on the substrate 101 is covered, thereby improving heat dissipation efficiency of the display panel 1.

Optionally, the display device may be an electronic paper, a mobile phone, a tablet computer, a television, a display, a laptop computer, a digital photo frame, a navigator, or any product or component having a display function. Moreover, when the heat dissipation structure according to the embodiments of the present disclosure is adopted to dissipate heat, the heat dissipation effect is effectively improved, which helps improve the lifespan of the display device. These effects are particularly obvious when the display device is a product with greater heat dissipation requirements, such as a mobile phone, a tablet computer, a laptop computer or the like.

The embodiments of the present disclosure at least have the following technical effects.

1. A gap is formed between at least a partial region of the heat dissipation structure 2 and the substrate 101 of the display panel 1. The thermal conductive material filled in the gap is used to transfer the heat generated during operation of the display panel 1 to the heat dissipation structure 2 for dissipation, which is equivalent of an increase the surface area of the heat dissipation structure 2 when the same heat dissipation region on the substrate 101 is covered, thereby improving heat dissipation efficiency of the display panel 1.

2. The first curved surface structures 201 and the second curved surface structures 202 which are bent in opposite directions are arranged alternately, such that both sides of the heat dissipation structure 2 present a corrugated surface. A gap may be formed in a partial region when the corrugated surface is connected to the substrate 101 of the straight plate structure. By filling the gap with the thermal conductive material, on the premise of not affecting the heat transfer effect, the heat dissipation surface area of the heat dissipation structure 2 is further increased, which helps improve the heat dissipation efficiency.

3. The heat dissipation structure 2 of the corrugated structure includes a plurality of corrugation periods 21, and each corrugation period 21 includes a first curved surface structure 201 and a second curved surface structure 202. The second end of the first curved surface structure 201 and the first end of the second curved surface structure 202 are smoothly connected, which facilitates the filling of the thermal conductive layer 5.

4. The first curved surface structure 201 and the second curved surface structure 202 of heat dissipation structure 2 are rotationally symmetric structures. When the heat dissipation structure 2 is manufactured with a mould by one-time press molding, the manufacture of the mould of the heat dissipation structure 2 can be facilitated. In addition, as there is no need to consider the front side and back side of the first curved surface structure 201 and the second curved surface structure 202 during installation, the efficiency of installing the heat dissipation structure 2 can be improved.

5. The maximum distance between the first curved surface structure 201 and the second curved surface structure 202 in the thickness direction of heat dissipation structure 2 is the maximum distance between the top of the arc of the first curved surface structure 201 and the top of the arc of the second curved surface structure 202 in the thickness direction. The distance determines the overall thickness of the heat dissipation structure 2 after it is attached. The thickness of the entire display module will be affected if the distance is too large, and the heat dissipation effect of the heat dissipation structure 2 will be poor if the distance is too small.

6. Through combination of the shape design of the heat dissipation structure and thermal conductive material, the elasticity of heat dissipation structure is also increased on the premise of improving the heat dissipation performance, thereby improving the impact resistance of the display panel. For example, when the display panel encounters a falling ball impact, the heat dissipation structure and the thermal conductive material can absorb the impact energy, thereby improving the display screen's resistance to the falling ball impact.

In the descriptions of the present disclosure, it is to be understood that the orientation or positional relationship indicated by terms "center", "on", "under", "front", "back", "left", "right", "vertical", "horizontal", "top", "bottom", "inside", "outside", and the like is based on orientation or positional relationship shown in the accompanying drawings, and are merely used for ease of describing the present disclosure and for simplified descriptions, instead of indicating or implying that the indicated device or element must be in a particular orientation or be constructed and operated in a particular orientation. Therefore, the orientation or positional relationship should not be construed as limiting the present disclosure.

The terms "first", "second", and the like are merely used for descriptions and are not to be construed as indicating or implying any relative importance or implicitly indicating the number of indicated technical features. Thus, the feature defined by "first" and "second" may include one or more of the features explicitly or implicitly. In the descriptions of the present disclosure, "a plurality of" means two or more, unless otherwise specified.

In the descriptions of the present disclosure, it should be noted that unless expressly specified and defined otherwise, the terms "install", "connect with", "connected to" and the like are to be construed in a broad sense, and for example, may be fixedly connected, detachably connected, or integrally connected; and may be directly connected or indirectly connected through an intermediate medium, or may be in communication between two elements. For those of ordinary skill in the art, the specific meanings of the above terms may be understood in the present disclosure based on specific conditions.

In the descriptions of the present disclosure, the particular feature, structure, material, or characteristic may be combined in any suitable manner in any one or more embodiments or examples.

Described above are merely some embodiments of the present disclosure. It should be noted that improvements and modifications may be made without departing from the principles of the present disclosure, and such improvements and modifications shall fall within the protection scope of the present disclosure.

What is claimed is:

1. A display module, comprising: a display panel and a heat dissipation structure; wherein
the display panel comprises a substrate and a display substrate layer disposed on the substrate, and the heat dissipation structure is disposed on a side, distal from the display substrate layer, of the substrate; and
a gap is formed between at least a partial region of the heat dissipation structure and the substrate;
the heat dissipation structure comprises at least one protruding structure, wherein the gap is formed between each protruding structure and the substrate, and the protruding structure is protruded away from the substrate; and
the heat dissipation structure further comprises at least one transition structure, wherein the transition structure is connected to the protruding structure and comprises a recessed structure recessed toward the substrate, a maximum distance between the protruding structure and the recessed structure in a first direction ranges from 0.1 mm to 0.2 mm, the first direction being perpendicular to a surface, distal from the display substrate layer, of the substrate;

wherein the recessed structure comprises a second curved surface structure;

wherein in the case that the protruding structure comprises a first curved surface structure, a boundary of the first curved surface structure on a first section is in a first arc, and a boundary of the second curved surface structure on the first section is in a second arc, a radius of the first arc being equal to a radius of the second arc, the first section being perpendicular to a surface, distal from the display substrate layer, of the substrate.

2. The display module according to claim 1, wherein the protruding structure comprises a first curved surface structure.

3. The display module according to claim 1, wherein at least one of the first curved surface structure and the second curved surface structure is a hemispherical shell.

4. The display module according to claim 1, wherein at least one of the first curved surface structure and the second curved surface structure is acquired by bending a straight plate structure.

5. The display module according to claim 1, wherein the radius of the first arc and the radius of the second arc both range from 0.5 mm to 3 mm.

6. The display module according to claim 1, wherein the transition structure comprises a straight plate structure.

7. The display module according to claim 1, wherein the at least one protruding structure comprises at least one pair of protruding structures, two protruding structures in each pair of protruding structures being connected by the transition structure.

8. The display module according to claim 1, wherein the transition structure satisfies any of the followings:
a side, facing the substrate, of the transition structure is at least partially attached to the substrate; and
a gap is formed between the transition structure and the substrate.

9. The display module according to claim 1, wherein the gap between the heat dissipation structure and the substrate is filled with a thermal conductive material.

10. The display module according to claim 9, wherein the thermal conductive material comprises thermal conductive silicone.

11. The display module according to claim 1, wherein the heat dissipation structure is an integrated structure.

12. The display module according to claim 1, wherein a material of the heat dissipation structure at least comprises copper, aluminum, or an aluminum alloy.

13. The display module according to claim 1, wherein the display panel is an organic light emitting diode (OLED) display panel.

14. A display device, comprising a display module, wherein the display module comprises a display panel and a heat dissipation structure; wherein
the display panel comprises a substrate and a display substrate layer disposed on the substrate, and the heat dissipation structure is disposed on a side, distal from the display substrate layer, of the substrate; and
a gap is formed between at least a partial region of the heat dissipation structure and the substrate;
the heat dissipation structure comprises at least one protruding structure, wherein the gap is formed between each protruding structure and the substrate, and the protruding structure is protruded away from the substrate; and
the heat dissipation structure further comprises at least one transition structure, wherein the transition structure is connected to the protruding structure and comprises a recessed structure recessed toward the substrate, a maximum distance between the protruding structure and the recessed structure in a first direction ranges from 0.1 mm to 0.2 mm, the first direction being perpendicular to a surface, distal from the display substrate layer, of the substrate;

wherein the recessed structure comprises a second curved surface structure;

wherein in the case that the protruding structure comprises a first curved surface structure, a boundary of the first curved surface structure on a first section is in a first arc, and a boundary of the second curved surface structure on the first section is in a second arc, a radius of the first arc being equal to a radius of the second arc, the first section being perpendicular to a surface, distal from the display substrate layer, of the substrate.

* * * * *

UNITED STATES PATENT AND TRADEMARK OFFICE
CERTIFICATE OF CORRECTION

PATENT NO. : 11,917,859 B2
APPLICATION NO. : 17/776493
DATED : February 27, 2024
INVENTOR(S) : Zuquan Chen et al.

It is certified that error appears in the above-identified patent and that said Letters Patent is hereby corrected as shown below:

On the Title Page

Item (73) The assignees should read:
Chengdu BOE Optoelectronics Technology Co., Ltd. Chengdu, Sichuan (CN)
BOE Technology Group Co., Ltd. Beijing (CN)

Signed and Sealed this
Twenty-sixth Day of March, 2024

Katherine Kelly Vidal
*Director of the United States Patent and Trademark Office*